(12) United States Patent
Hao et al.

(10) Patent No.: US 10,158,024 B2
(45) Date of Patent: Dec. 18, 2018

(54) ARRAY SUBSTRATE AND DISPLAY DEVICE (71) Applicant: BOE TECHNOLOGY GROUP CO., LTD., Beijing (CN)

(72) Inventors: Xueguang Hao, Beijing (CN); Hongfei Cheng, Beijing (CN); Yong Qiao, Beijing (CN); Xinyin Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/535,635

(22) PCT Filed: Aug. 25, 2016

(86) PCT No.: PCT/CN2016/096727
§ 371 (c)(1),
(2) Date: Jun. 13, 2017

(87) PCT Pub. No.: WO2017/128711
PCT Pub. Date: Aug. 3, 2017

(65) Prior Publication Data
US 2018/0108773 A1    Apr. 19, 2018

(30) Foreign Application Priority Data

Jan. 27, 2016    (CN) .................... 2016 2 0080097 U (51) Int. Cl.
*H01L 29/786*    (2006.01)
*G02F 1/1362*    (2006.01)
(Continued)

(52) U.S. Cl.
CPC .......... *H01L 29/786* (2013.01); *G02F 1/1362* (2013.01); *G02F 1/133555* (2013.01);
(Continued)

(58) Field of Classification Search
CPC ............. H01L 29/786; G02F 1/136213; G02F 1/136227
See application file for complete search history.

(56) References Cited

U.S. PATENT DOCUMENTS

2005/0134540 A1    6/2005    Kim
2006/0125984 A1    6/2006    Park et al.
(Continued)

FOREIGN PATENT DOCUMENTS

CN    1629705 A    6/2005
CN    1790141 A    6/2006
(Continued)

OTHER PUBLICATIONS

Search Report and Written Opinion dated Nov. 25, 2016 from State Intellectual Property Office of the P.R. China.
Office Action from Taiwan Patent Office dated Dec. 25, 2017.

*Primary Examiner* — Dung Le
(74) *Attorney, Agent, or Firm* — Dilworth & Barrese, LLP.; Michael J. Musella, Esq.

(57) ABSTRACT

An array substrate and a display device are provided. The array substrate includes a base substrate and a gate metal layer, an active layer and a source/drain metal layer disposed on the base substrate; the gate metal layer includes a gate line and a storage electrode line that extends in parallel to the gate line; the active layer includes a first pattern taken as a channel region of a thin-film transistor (TFT) and a second pattern at least partially overlapped with the storage electrode line in a thickness direction of the base substrate, or the source/drain metal layer includes a data line pattern and a metal layer pattern at least partially overlapped with the storage electrode line in the thickness direction of the base substrate.

18 Claims, 4 Drawing Sheets

(51) Int. Cl.
  *G02F 1/1335*  (2006.01)
  *G03F 9/00*  (2006.01)
  *H01L 29/417*  (2006.01)
  *H01L 27/12*  (2006.01)

(52) U.S. Cl.
  CPC .. *G02F 1/136213* (2013.01); *G02F 1/136227* (2013.01); *G02F 1/136286* (2013.01); *G03F 9/7042* (2013.01); *G03F 9/7088* (2013.01); *H01L 27/124* (2013.01); *H01L 27/1255* (2013.01); *H01L 27/1288* (2013.01); *H01L 29/41733* (2013.01); *H01L 27/127* (2013.01)

(56) References Cited

U.S. PATENT DOCUMENTS

| | | |
|---|---|---|
| 2006/0157705 A1 | 7/2006 | Ki |
| 2006/0180813 A1 | 8/2006 | Kim et al. |
| 2006/0215069 A1 | 9/2006 | Yamasaki |
| 2006/0238667 A1 | 10/2006 | Lee |
| 2007/0262936 A1 | 11/2007 | Chang et al. |
| 2012/0081274 A1 | 4/2012 | Chang et al. |
| 2016/0005804 A1* | 1/2016 | Oh .................. H01L 51/0562 257/72 |
| 2017/0062545 A1* | 3/2017 | Oh .................. H01L 27/3276 |
| 2017/0200742 A1* | 7/2017 | Shin ................. H01L 27/127 |

FOREIGN PATENT DOCUMENTS

| | | |
|---|---|---|
| CN | 1828395 A | 9/2006 |
| CN | 101071263 A | 11/2007 |
| CN | 205318071 U | 6/2016 |
| TW | 200641492 A | 12/2006 |

* cited by examiner

ARRAY SUBSTRATE AND DISPLAY DEVICE

TECHNICAL FIELD

Embodiments of the present disclosure relate to an array substrate and a display device.

BACKGROUND

The display modes of display devices include twisted nematic (TN), vertical alignment (VA), in-plane switching (IPS), fringe field switching (FFS), etc. Pixel structures usually adopt different storage capacitor structures according to different modes. For instance, the TN mode and the VA mode generally adopt the structure in which a storage capacitor is provided between a common electrode line and a pixel electrode. The IPS mode and the FFS mode generally adopt the structure in which a storage capacitor is formed between a common electrode and a pixel electrode. The structure of the storage capacitor affects the stability of pixel voltage and hence directly affects the quality and the yield of a display.

SUMMARY

With respect to the above problem, at least one embodiment of the present disclosure relates to an array substrate and a display device, which are used for reducing the crosstalk and poor display of the display device.

An aspect of the present disclosure provides an array substrate, comprising: a base substrate; and a gate metal layer, an active layer and a source/drain metal layer disposed on the base substrate. The gate metal layer includes a gate line and a storage electrode line that extends in parallel to the gate line; and the active layer includes a first pattern taken as a channel region of a thin-film transistor (TFT) and a second pattern at least partially overlapped with the storage electrode line in a thickness direction of the base substrate, or the source/drain metal layer includes a data line pattern and a metal layer pattern at least partially overlapped with the storage electrode line in the thickness direction of the base substrate.

In an embodiment, for example, the active layer includes the first pattern taken as the channel region of the TFT and the second pattern at least partially overlapped with the storage electrode line in the thickness direction of the base substrate, and the source/drain metal layer includes the data line pattern and the metal layer pattern at least partially overlapped with the storage electrode line in the thickness direction of the base substrate.

In an embodiment, for example, the active layer is disposed between the base substrate and the gate metal layer.

In an embodiment, for example, the gate metal layer is disposed between the base substrate and the active layer.

In an embodiment, for example, the second pattern is connected with the first pattern.

In an embodiment, for example, the second pattern includes a connection part and an overlapping part connected with the connection part; the connection part is connected with the first pattern; and the overlapping part is overlapped with the storage electrode line in the thickness direction of the base substrate.

In an embodiment, for example, the overlapping part is disposed at an intersection position between the storage electrode line and the data line.

In an embodiment, for example, the connection part and the data line have a same extension direction, and an orthographic projection of the connection part on a first primary surface of the base substrate is disposed in an orthographic projection of the data line on the first primary surface of the base substrate.

In an embodiment, for example, a dimension of the overlapping part is greater than that of the connection part in a transverse direction of the data line.

In an embodiment, for example, the overlapping part is a platy structure.

In an embodiment, for example, the storage electrode line is provided with a widened portion at an intersection position between the storage electrode line and the data line.

In an embodiment, for example, an orthographic projection of the widened portion on the first primary surface of the base substrate coincides with an orthographic projection of the overlapping part on the first primary surface of the base substrate.

In an embodiment, for example, the metal layer pattern is disposed at an intersection position between the storage electrode line and the data line.

In an embodiment, for example, the metal layer pattern and the data line are in an integral structure.

In an embodiment, for example, the metal layer pattern is a platy structure.

In an embodiment, for example, a dimension of the metal layer pattern in a transverse direction of the data line is greater than a width of the data line.

In an embodiment, for example, the dimension of the metal layer pattern in a transverse direction of the storage electrode line is not greater than a width of the storage electrode line.

In an embodiment, for example, the storage electrode line is provided with a widened portion at an intersection position between the storage electrode line and the data line.

In an embodiment, for example, an orthographic projection of the widened portion on a first primary surface of the base substrate coincides with an orthographic projection of the metal layer pattern on the first primary surface of the base substrate.

Another aspect of the present disclosure provides a display device comprising any one of the above-described array substrates.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

FIG. 3b is a schematic top view of an array substrate comprising an active layer structure as illustrated in FIG. 3a;

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Figure 1:
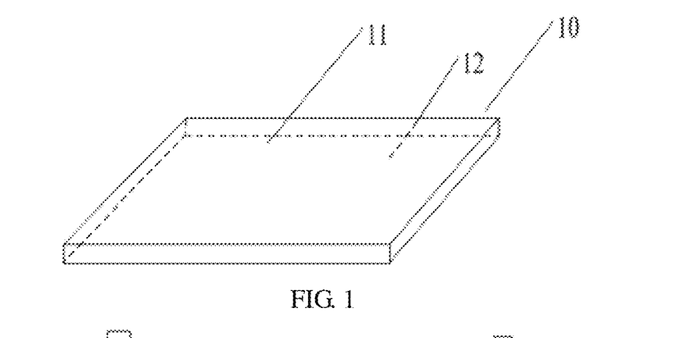
FIG. 1 is a schematic structural view of a base substrate.

A liquid crystal display (LCD) device generally comprises components such as a backlight module, a lower substrate, an upper substrate, and a peripheral drive circuit. The lower substrate is usually an array substrate, and the upper substrate is usually a color filter (CF) substrate. The array substrate further comprises a base substrate (usually a glass substrate) and structures such as gate lines, active layers, data lines, common electrode lines, and pixel electrodes disposed on the base substrate. FIG. 1 is a schematic structural view of a base substrate. As illustrated in FIG. 1, the base substrate 10 includes a first primary surface 11 and a second primary surface 12 arranged opposite to each other. For instance, the structures such as the gate lines, the active layers, the data lines, the common electrode lines and the pixel electrodes are disposed on one side of the first primary surface 11 of the base substrate 10.

In an LCD device, thin-film transistors (TFTs) are usually adopted as switches for controlling data signals applied to pixel electrodes. A TFT includes a source electrode, a drain electrode, a gate electrode and a channel region for separating the source/drain electrodes. The channel region of the TFT has the characteristic that the source/drain electrodes of the TFT can be conducted upon the TFT being applied with certain turn-on voltage. For instance, the channel region may be made from a semiconductor material (e.g., amorphous silicon (a-Si), polycrystalline silicon (poly-Si) or oxide semiconductor). For instance, the connection of the TFT is implemented as follows: the gate electrode is connected with a gate line to receive a turn-on voltage signal applied to the gate line; the turn-on voltage signal is applied to affect the channel region through the gate electrode of the TFT, so as to control the state of turn-on or turn-off of the channel region; the source electrode is connected with a data line to receive a voltage signal from the data line; and the drain electrode is connected with the pixel electrode to charge the pixel electrode after the source electrode and the drain electrode of the TFT are conducted through the channel region. That is to say, after the source electrode and the drain electrode of the TFT are conducted, the signal over the data line can be applied to the pixel electrode through the source electrode and the drain electrode of the TFT and then can be used for controlling the deflection of liquid crystal molecules.

In an LCD device, as the charging time of the pixel electrode is far less than the response time of the liquid crystal molecules, the deflection of the liquid crystal molecules is usually conducted and completed within the retention time period after the end of the charging process of the pixel electrode. That is to say, after the charging process of the pixel electrode is ended, a stable charging voltage is required to continuously drive the liquid crystal molecules to rotate. A pixel capacitor functions to keep the continuous charging voltage. The pixel capacitor mainly includes a liquid crystal capacitor and a storage capacitor. The function of the storage capacitor is, for instance, to maintain the stability of the pixel voltage and hence improve the display quality. In different display modes, the storage capacitor has different forming structure. For instance, the TN and VA modes usually adopt the structure in which a storage capacitor is formed between a common electrode line and a pixel electrode; and the IPS, FFS and advanced super dimension switch (ADS) modes usually adopt the structure in which a storage capacitor is formed between a common electrode and a pixel electrode. The structure of the storage capacitor will directly affect the quality and the yield of a display.

An embodiment of the present disclosure provides an array substrate, which comprises a base substrate and a gate metal layer, an active layer and a source/drain metal layer disposed on the base substrate, the gate metal layer includes a gate line and a storage electrode line that extends in parallel to the gate line; and the active layer includes a first pattern taken as a channel region of a TFT and a second pattern at least partially overlapped with the storage electrode line in the thickness direction of the base substrate, or the source/drain metal layer includes a data line pattern and a metal layer pattern at least partially overlapped with the storage electrode line in the thickness direction of the base substrate. The array substrate provided by the embodiment of the present disclosure can obtain large storage capacitance and hence improve the display quality of the display device.

It should be noted that: in the embodiment of the present disclosure, the storage capacitor is formed by the storage electrode line (which may also be referred to as a common electrode line, but hereafter referred to as storage electrode line) and the source/drain metal layer and/or the active layer. If the storage capacitor structure is formed by the source/drain metal layer and the storage electrode line, the metal layer pattern, for instance, may be an integral structure that may be directly connected with the data line. The metal layer pattern, for instance, may also be not connected with the data line, namely the source/drain metal layer includes a metal layer pattern independently arranged in addition to the data line and overlapped with the storage electrode line in the thickness direction of the array substrate. If the storage capacitor structure is formed by the active layer and the storage electrode line, the active layer at least includes two pattern parts, in which one pattern part is, for instance, taken as a pattern of the channel region of the TFT, and the other pattern part, for instance, at least includes a portion overlapped with the storage electrode line in the thickness direction of the array substrate so as to form the storage capacitor. In a similar manner, the above two patterns of the active layer, for instance, may be connected or not connected with each other.

In one embodiment, the active layer includes a first pattern taken as the channel region of the TFT and a second pattern at least partially overlapped with the storage electrode line in the thickness direction of the base substrate.

Figure 2A:
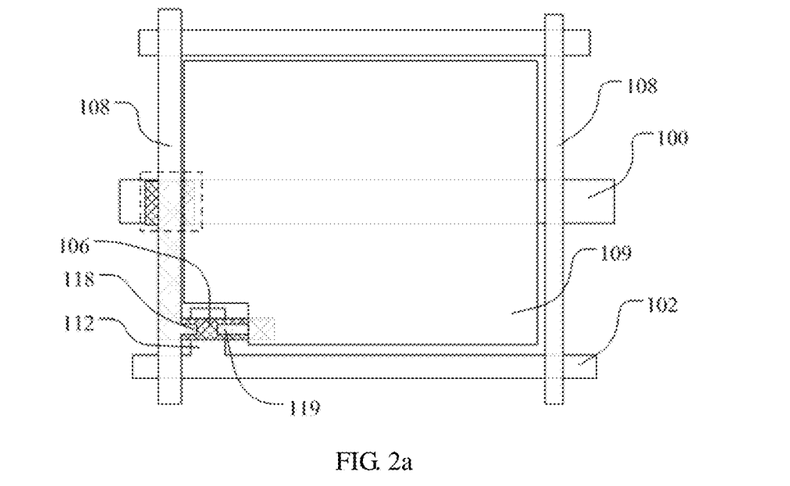
FIG. 2a is a schematic top view illustrating the structure of forming a storage capacitor with an active layer and a storage electrode line in an array substrate provided by an embodiment of the present disclosure.
Figure 2B:
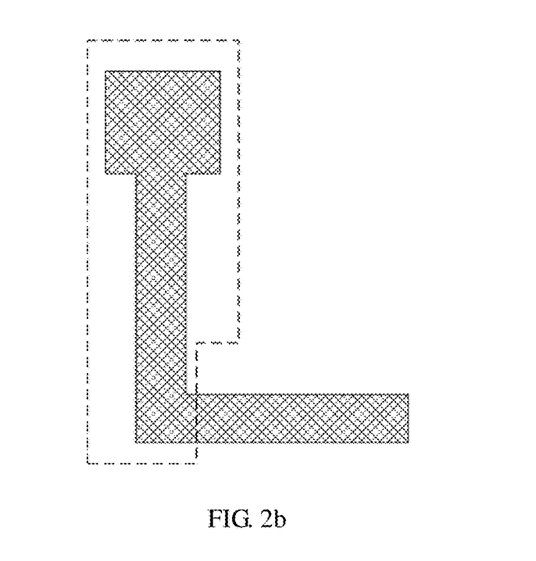
FIG. 2b is a schematic structural view of an active layer in the embodiment of the present disclosure.

FIG. 2a is a schematic top view illustrating the case of forming a storage capacitor with an active layer and a storage electrode line in an embodiment of the present disclosure. FIG. 2b is a schematic structural view of the active layer in the embodiment of the present disclosure.

As illustrated in FIGS. 2a-2b, the array substrate comprises a base substrate and a gate metal layer, an active layer (including patterns illustrated with shade lines in FIGS. 2a and 2b) and a source/drain metal layer disposed on the base substrate. The gate metal layer includes a gate line 102 (and a gate electrode 112 branched from the gate line) and a storage electrode line 100 extended in parallel to the gate line. The active layer is disposed on the gate metal layer (a bottom-gate structure). The active layer 106 includes a first pattern taken as a channel region of a TFT and a second pattern at least partially overlapped with the storage electrode line in the thickness direction of the base substrate. It should be noted here that a part of the active layer disposed below a pixel electrode layer is illustrated in FIG. 2a at low visibility; and a part of the active layer under the data line is invisible, but for clear illustration of the arrangement of the active layer in the array substrate, this part of the active layer is also illustrated at low visibility in FIG. 2a. Similarly, the active layer is also subjected to the same visibility treatment in FIGS. 3b and 5 below, which is also explained here. As illustrated in FIG. 2b, the part of the active layer encircled by dotted lines is, for instance, the second pattern, and the part of the active layer on the outside of the dotted lines is, for instance, the first pattern. With reference to FIG. 2a, one part of the first pattern (the part disposed above the gate electrode) is taken as the channel region of the TFT, and the second pattern is at least partially overlapped with the storage electrode line 100 in the thickness direction of the base substrate. For instance, a part of the second pattern, which is basically square, is overlapped with the storage electrode line 100 in the thickness direction of the base substrate, so as to form the storage capacitor (namely the part encircled by dotted lines in FIG. 2a).

It should be noted that the source/drain metal layer is further disposed on the active layer. As illustrated in FIG. 2a, the source/drain metal layer includes a data line 108 intersected with the gate line 102, and includes the source electrode 118 and the drain electrode 119 of the TFT. A pixel electrode 109 may be disposed above the source/drain metal layer. As described above, the source electrode 118 of the TFT is connected with the data line 108; the drain electrode 119 is, for instance, connected with the pixel electrode 109 through a through hole (not illustrated in the figure) formed in an insulating layer; and the gate electrode is connected with the gate line 102.

In the embodiment, for instance, the active layer may be disposed between the base substrate and the gate metal layer. That is to say, the array substrate provided by the present disclosure may be in a top-gate structure. As for a top-gate structure, an active layer at least including a first pattern and a second pattern is formed on the base substrate at first, and subsequently, a gate insulating layer is formed on the active layer; and a gate metal layer is formed on the gate insulating layer. As described above, the gate metal layer includes a gate line and a storage electrode line that extend in parallel to each other. The second pattern is at least partially overlapped with the storage electrode line in the thickness direction of the base substrate, so as to form the storage capacitor.

In the embodiment, for instance, the gate metal layer is disposed between the base substrate and the active layer. That is to say, the array substrate provided by the embodiment of the present disclosure may be in a bottom-gate structure. For instance, FIG. 2a illustrates an embodiment of the array substrate having the bottom-gate structure. As for a bottom-gate structure, a gate metal layer including a gate line and a storage electrode line that extend in parallel to each other is formed on the base substrate at first, and subsequently, a gate insulating layer is formed on the gate metal layer; and active layer at least including a first pattern and a second pattern is formed on the gate insulating layer. The second pattern is at least partially overlapped with the storage electrode line in the thickness direction of the base substrate, so as to form the storage capacitor.

Figure 3A:
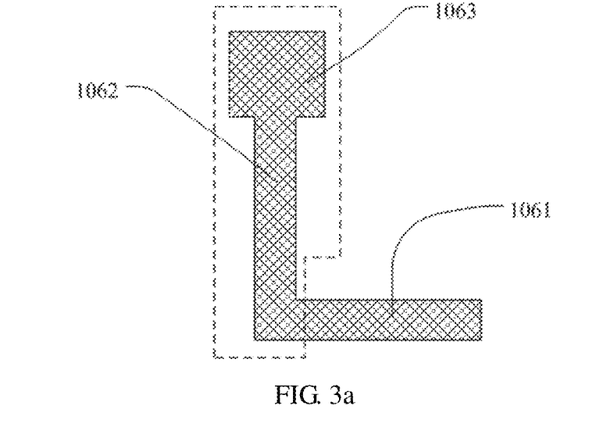
FIG. 3a is a schematic structural view of an active layer in an embodiment of the present disclosure.
Figure 3B:
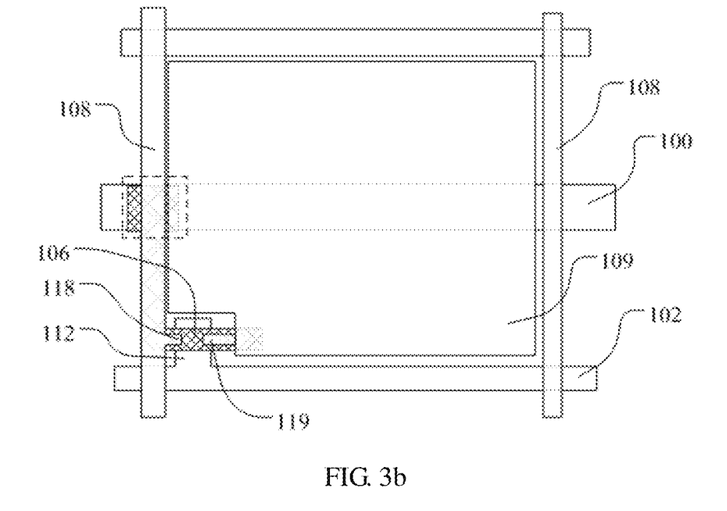

In the embodiment, for instance, the second pattern is connected with the first pattern. FIG. 3a illustrates a structure of the active layer in the embodiment of the present disclosure. FIG. 3b is a schematic top view of an array substrate comprising the structure of the active layer as illustrated in FIG. 3a. As illustrated in FIG. 3a, the active layer includes a first pattern (the part not within dotted lines in the drawing) and a second pattern (the part within the dotted lines in the drawing). The second pattern is directly connected with the first pattern, namely the second pattern and the first pattern are in an integral structure. For instance, the second pattern may also be separate from the second pattern, namely two mutually separate patterns are formed on the active layer.

In the embodiment, for instance, the second pattern includes a connection part and an overlapping part connected with the connection part; the connection part is connected with the first pattern; and the overlapping part is overlapped with the storage electrode line in the thickness direction of the base substrate. Continuously referring to FIG. 3a, the second pattern (the part encircled by dotted lines in the drawing) includes a connection part 1062 and an overlapping part 1063. The connection part 1062 is connected to the first pattern, and the overlapping part 1063 is overlapped with the storage electrode line 100 in the thickness direction of the base substrate, so as to form the storage capacitor.

The first pattern as illustrated in FIG. 3a includes a channel region 1061 of the TFT. As illustrated in FIG. 3b, when the channel region 1061 of the first pattern receives the effect of the turn-on voltage from the gate electrode 112, the channel region 1061 is switched on. The voltage signal of the data line is transmitted from the source electrode of the TFT to the drain electrode of the TFT through the channel region 1061, so as to charge the pixel electrode. It should be noted that the shape of the first pattern of the active layer is not limited to the structure as illustrated in FIG. 3a, for instance, the first pattern may also be in other shapes. In addition, the overlapping part, for instance, may be a rectangle, a square, a circle, an ellipse or other regular or an irregular platy structure. The specific structure as illustrated in FIG. 3a shall not be construed as the limitation of the present disclosure.

In the embodiment, for instance, the overlapping part is disposed at an intersection position between the storage electrode line and the data line. As illustrated in FIG. 3b, the overlapping part 1063 is disposed at an intersection position between the storage electrode line 100 and the data line 108. The arrangement of the overlapping part at the intersection position between the storage electrode line and the data line can prevent the reduction of the aperture ratio.

In the embodiment, for instance, the connection part and the data line have the same extension direction, and an orthographic projection of the connection part on the first primary surface of the base substrate is within an orthographic projection of the data line on the first primary surface of the base substrate. Continuously referring to FIG. 3b, the connection part 1062 and the data line 108 have the same extension direction, and an orthographic projection of the connection part 1062 on the first primary surface of the base substrate is within an orthographic projection of the data line 108 on the first primary surface of the base substrate. The setting of the extension direction and the dimension of the connection part can avoid the reduction of the aperture ratio of the display device.

In the embodiment, for instance, the dimension of the overlapping part 1063 is greater than that of the connection part 1062 in the transverse (width) direction of the data line 108, so as to obtain large storage capacitance.

In the embodiment, for instance, the overlapping part is a platy structure. The dimension of the storage capacitor depends on the opposite area between metal plates opposite to each other on one hand, and depends on the distance between the metal plates on the other hand. As the overlapping part is set to be platy, the opposite area between a corresponding position of the overlapping part and the storage electrode line can be increased, so that the storage capacitance can be increased, and hence the problems of flicker and crosstalk can be effectively prevented. The shape of the platy structure as stated here is, for instance, a rectangle, a square, a circle or other regular or an irregular shape.

Figure 4A:
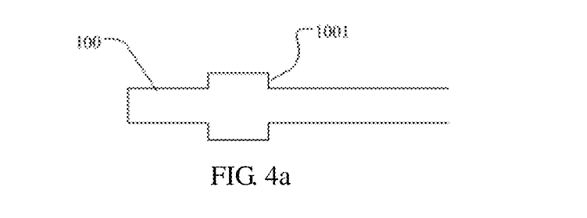
FIG. 4a is a schematic diagram illustrating the example that the storage electrode line includes a widened portion in an embodiment of the present disclosure.
Figure 4B:
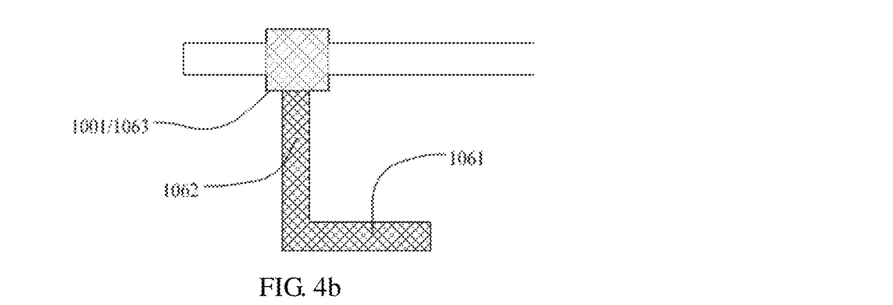
FIG. 4b is a schematic structural view illustrating the example that the storage electrode line includes a widened portion and a storage capacitor is formed by the widened portion and the active layer in an embodiment of the present disclosure.

In the embodiment, for instance, the storage electrode line is provided with a widened portion at an intersection position between the storage electrode line and the data line. FIG. 4a is a schematic diagram illustrating the example that the storage electrode line includes a widened portion in the embodiment of the present disclosure. FIG. 4b is a schematic structural view illustrating the structure of forming a storage capacitor by the storage electrode line including the widened portion and the active layer in the embodiment of the present disclosure.

As illustrated in FIG. 4a, for instance, the storage electrode line 100 is provided with a widened portion 1001 at the intersection position between the storage electrode line with the data line 108 (only one widened portion is illustrated in the figure). The widened portion 1001 has the function of increasing the opposite area between the widened portion and the overlapping part 1063, so as to increase the storage capacitance and hence improve the display effect. For instance, moreover, the widened portion 1001 may be set to be a rectangle, a square, a circle or other shapes. For instance, the widened portion 1001 is set to have the same shape as the overlapping part 1063 of the active layer as described above, so as to improve the storage capacitance. For instance, the widened portion 1001 and the overlapping part 1063 have the same shape and area and are arranged opposite to each other. As illustrated in FIG. 4b, for instance, an orthographic projection of the widened portion 1001 on the first primary surface of the base substrate coincides with an orthographic projection of the overlapping part 1063 on the first primary surface of the base substrate. The limitation of the shape and the area of the widened portion and the overlapping part can effectively utilize the area of the overlapping part and the widened portion to obtain large storage capacitance, and hence improve the display effect of the display device.

It should be noted that: in general, the setting of the widened portion of the storage electrode line is matched with the overlapping part. For instance, as described above, the widened portion and the overlapping part are set to have an equal dimension and the same shape, so that the opposite area between the widened portion and the overlapping part can be maximum, and hence large storage capacitance can be obtained.

In one embodiment, the source/drain metal layer includes a data line pattern and a metal layer pattern at least partially overlapped with the storage electrode line in the thickness direction of the base substrate.

Figure 5:
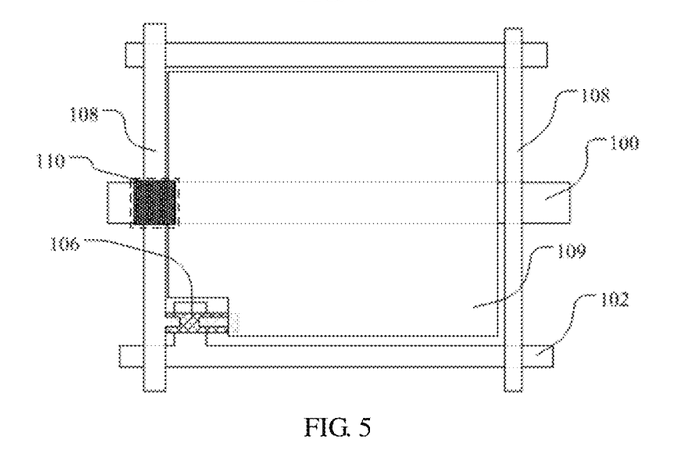
FIG. 5 is a schematic top view illustrating the structure of forming a storage capacitor with a source/drain metal layer and a storage electrode line, in the array substrate provided by the embodiment of the present disclosure.

FIG. 5 is a schematic top view illustrating the case of forming a storage capacitor with a source/drain metal layer and a storage electrode line in the array substrate provided by an embodiment of the present disclosure. As illustrated in FIG. 5, the array substrate comprises a base substrate and a gate metal layer, an active layer and a source/drain metal layer disposed on the array substrate. The gate metal layer includes a gate line 102 (and a gate electrode) and a storage electrode line 100 that extend in parallel. The active layer includes a channel region of a TFT. The source/drain metal layer includes a data line pattern and a metal layer pattern 110 overlapped with the storage electrode line 100 in the thickness direction of the base substrate (namely a part of the source/drain metal layer encircled by dotted lines in FIG. 5). Thus, a storage capacitor is formed with the metal layer pattern 110 and the storage electrode line 100. The structure of forming the storage capacitor with the source/drain metal layer and the storage electrode line can obtain large storage capacitance and hence improve the display effect of the display device.

In the embodiment, for instance, the active layer may be disposed between the base substrate and the gate metal layer. That is to say, the array substrate may be in a top-gate structure. As for a top-gate structure, an active layer is formed on the base substrate at first, and subsequently, a gate insulating layer covering the active layers is formed on the active layer; and a gate metal layer is formed on the gate insulating layer. As described above, the gate metal layer includes a gate line and a storage electrode line that extend in parallel. Subsequently, for instance, an interlayer insulating layer is formed on the gate metal layer, and the source/drain metal layer is formed on the interlayer insulating layer. The source/drain metal layer shall at least include a data line pattern and the metal layer pattern.

In the embodiment, for instance, the gate metal layer is disposed between the base substrate and the active layer. That is to say, the array substrate may be in a bottom-gate structure. As for a bottom-gate structure, a gate metal layer including a gate line and a storage electrode line that extend in parallel is formed on the base substrate at first, and subsequently, a gate insulating layer is formed on the gate metal layer; and an active layer is formed on the gate insulating layer. Subsequently, a source/drain metal layer is formed on the active layer. The source/drain metal layer at least includes a data line pattern and the metal layer pattern.

It should be noted that: in the embodiment, the active layer may also include a first pattern taken as the channel region of the TFT and a second pattern at least partially overlapped with the storage electrode line in the thickness direction of the base substrate. That is to say, the active layer includes the structure that is described above or the modification of the structure. The storage capacitor is formed by the storage electrode line and the source/drain metal layer as well as the active layer simultaneously, so that the storage capacitance can be further increased, and hence the crosstalk and poor display of the display device can be better avoided.

In the embodiment, for instance, the metal layer pattern is disposed at an intersection position between the storage electrode line and the data line, so as to prevent the reduction of the aperture ratio. Continuously referring to FIG. 5, the metal layer pattern 110 is disposed at an intersection position between the storage electrode line 100 and the data line 108. The metal layer pattern 110 and the data line 108 are, for instance, in an integral structure, for instance, both are formed from the same metal layer through a patterning process. For instance, the metal layer pattern 110 includes a part of the data line, which part is intersected with the storage electrode line, and projection parts from the part of the data line to both sides of the data line. As the data line and the metal layer pattern adopt an integral structure, the reduction of the aperture ratio of the display device can be avoided.

In the embodiment, for instance, the metal layer pattern is a platy structure. For instance, the shape of the metal layer pattern may be a rectangle, a square or other regular or an irregular shape.

Figure 6:
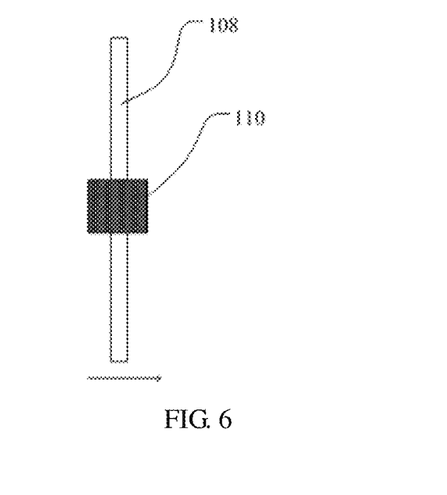
FIG. 6 is a schematic diagram illustrating the dimensional relationship between a metal layer pattern and a data line in the transverse direction of the data line, in an embodiment of the present disclosure.

In an embodiment, for instance, the dimension of the metal layer pattern in the transverse direction of the data line is greater than the width of the data line. FIG. 6 is a schematic diagram illustrating the dimensional relationship between the metal layer pattern and the data line in the transverse direction of the data line, in the embodiment of the present disclosure. As illustrated in FIG. 6, the metal layer pattern 110, namely the part illustrated by shade line in the figure, is disposed over the data line 108. As described above, both the data line 108 and the metal layer pattern 110 are disposed in the source/drain metal layer. The dimension of the metal layer pattern 110 in the transverse direction (the direction illustrated by an arrowhead in FIG. 6) of the data line 108 is greater than the width of the data line 108. For instance, as described above, the metal layer pattern 110 and the data line 108 may be in an integral structure, for instance, both are formed from the same metal layer by the patterning process. As the width of the metal layer pattern is greater than the width of the data line, large storage capacitance can be obtained, so that the crosstalk and poor display of the display device can be prevented.

Figure 7:
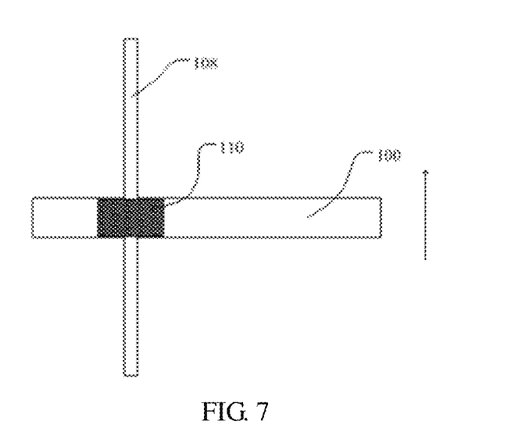
FIG. 7 is a schematic diagram illustrating the dimensional relationship between a metal layer pattern and a storage electrode line in the transverse direction of the storage electrode line in an embodiment of the present disclosure.

In the embodiment, for instance, the dimension of the metal layer pattern in the transverse direction of the storage electrode line is not greater than the width of the storage electrode line. FIG. 7 is a schematic diagram illustrating the dimensional relationship between the metal layer pattern and the storage electrode line in the transverse direction of the storage electrode line in an embodiment of the present disclosure. As illustrated in FIG. 7, as described above, the data line 108 and the storage electrode line 100 are intersected with each other. The metal layer pattern 110 is disposed at an intersection position between the data line 108 and the storage electrode line 100. In the transverse direction of the storage electrode line 100 (namely the direction illustrated by an arrowhead in FIG. 7), the dimension of the metal layer pattern 110 is not greater than the width of the storage electrode line 100, for instance, may be equal to or slightly less than the width of the storage electrode line 100, so as to prevent the reduction of the aperture ratio of the display device.

Figure 8:
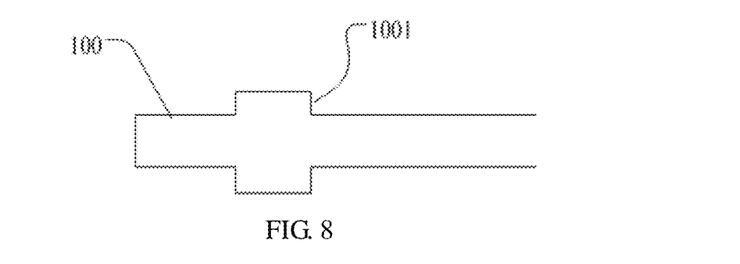
FIG. 8 is a schematic diagram of a storage electrode line including a widened portion in an embodiment of the present disclosure.
Figure 9:
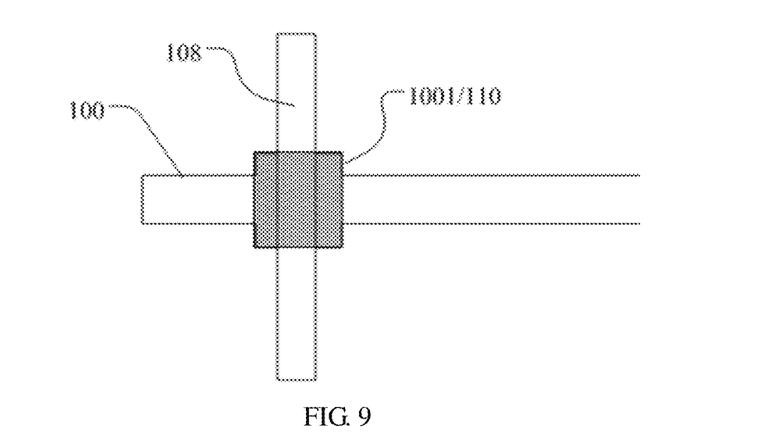
FIG. 9 is a schematic diagram illustrating the structure of forming a storage capacitor by a widened portion of a storage electrode line and a metal layer pattern in an embodiment of the present disclosure.

In the embodiment, for instance, the storage electrode line is provided with a widened portion at an intersection position between the storage electrode line and the data line. FIG. 8 is a schematic diagram illustrating the example that the storage electrode line includes a widened portion, in the embodiment of the present disclosure. FIG. 9 is a schematic diagram illustrating the structure of forming a storage capacitor by the widened portion of the storage electrode line and the metal layer pattern, in an embodiment of the present disclosure. As illustrated in FIG. 8, for instance, a widened portion 1001 is disposed at the intersection position between the storage electrode line 100 and the data line 108 (only one intersection position is illustrated in the figure as an example). The widened portion 1001 has the function of increasing the opposite area between the widened portion and, for instance, the metal layer pattern, so as to increase the storage capacitance. For instance, moreover, the widened portion 1001 may be set to be a rectangle, a square or other regular or an irregular shape, for instance, have the same shape as the metal layer pattern as described above, so as to increase the storage capacitance. Moreover, as illustrated in FIG. 9, an orthographic projection of the widened portion 1001 on the first primary surface 11 of the base substrate coincides with an orthographic projection of the metal layer pattern 110 on the first primary surface 11 of the base substrate, so as to further increase the storage capacitance. As the widened portion is disposed at the intersection position between the storage electrode line and the data line, large storage capacitance can be obtained, and hence the display effect of the display device can be improved.

It should be noted that: in general, the setting of the widened portion of the storage electrode line is matched with the metal layer pattern, so as to obtain large storage capacitance. For instance, as described above, the widened portion and the metal layer pattern are set to have an equal dimension and the same shape, so that the opposite area between the widened portion and the metal layer pattern can be maximum, and hence large storage capacitance can be obtained.

The above embodiments may be mutually combined without departing from the scope of the present disclosure, and can obtain better combination effect.

With respect to the array substrate provided by an embodiment, the embodiment of the present disclosure provides a method for manufacturing an array substrate. But the method for manufacturing the array substrate, provided by the present disclosure, is not limited to the following method.

Description will be given below to the method for manufacturing the array substrate, provided by an embodiment of the present disclosure, by only taking the case of manufacturing the array substrate having the top-gate structure, in which the active layer includes a first pattern taken as the channel of the TFT and a second pattern at least partially overlapped with the storage electrode line in the thickness direction of the base substrate, as an example. The method, for instance, is specifically described as follows.

Firstly, a metal layer is formed on a substrate by, for instance, a sputtering method, and subsequently, a gate line, a gate electrode connected with the gate line, and a storage electrode line, which extends in parallel to the gate line and simultaneously formed along with the gate line and the gate electrode, are obtained by etching via a first mask. The metal layer, for instance, may be made from aluminum, aluminum alloy and copper or other adequate materials. The gate line, the gate electrode connected with the gate line, and the storage electrode line that extends in parallel to the gate line are formed on the array substrate after the first masking process is adopted for patterning.

Secondly, an insulating layer is formed on the array substrate provided with the gate line and the gate electrode and taken as a gate insulating layer, and subsequently, a semiconductor layer is formed on the insulating layer, and an active layer of a TFT is formed by patterning process. The active layer is disposed on the insulating layer and includes a first pattern corresponding to the gate electrode. The active layer may be formed by photolithography. The mask is designed to be a pattern corresponding to the active layer; the part of the active layer in other regions is removed by, for instance, a photolithography process; and then the active layer, including the first pattern corresponding to the gate electrode and a second pattern at least partially overlapped with the storage electrode line in the thickness direction of the base substrate, is obtained. The material for forming the active layer, for instance, may be a-Si, poly-Si, oxide semiconductor or other adequate material.

It should be noted that the formed active layer, for instance, at least includes the first pattern taken as the channel of the TFT and the second pattern at least partially overlapped with the storage electrode line in the thickness direction of the base substrate. The pattern on the mask at least includes parts corresponding to the first pattern and the second pattern. As described above, the first pattern and the second pattern, for instance, may be connected with or separate from each other.

Thirdly, a metal layer is further formed on the substrate provided with the active layer. The material of the metal layer, for instance, may be aluminum, aluminum alloy, copper or other adequate material. The method for forming the metal layer, for instance, may be chemical vapor deposition (CVD) or sputtering. The metal layer is patterned by a photolithography process via a mask including the pattern for the source electrode, the drain electrode and the data line, and subsequently, the data line that is intersected with the gate line and the storage electrode line, and the source electrode and drain electrode spaced from each other are formed above the active layer.

Fourthly, structures such as a passivation layer and a passivation layer through hole may be further formed on the source electrode, the drain electrode and the data line.

Finally, a transparent conductive layer (e.g., indium tin oxide (ITO)) continuously covers the passivation layer, and an array substrate structure provided by one embodiment of the present disclosure is obtained by photolithography process via a mask.

In other embodiments of the present disclosure, photolithography may be performed by correspondingly changing the mask pattern or the photolithography steps. No further description will be given here.

Another aspect of the present disclosure provides a display device, which comprises any of the foregoing array substrates.

One example of the display device is an LCD device; a liquid crystal cell is formed by the cell-assembly of an array substrate and an opposing substrate, and a liquid crystal material is filled in the liquid crystal cell. The opposing substrate is, for instance, a color filter substrate. A pixel electrode of each pixel unit of the array substrate is used for applying an electric field to control the rotation degree of the liquid crystal materials, so as to perform display operation. In some examples, the LCD device further comprises a backlight module for emitting backlight for the array substrate.

Another example of the display device is an organic light-emitting diode (OLED) display device; an OLED material stack layer is formed on the array substrate, and the pixel electrode of each pixel unit is taken as an anode or a cathode and configured to drive the OLED material to emit light so as to perform display operation.

Still another example of the display device is an e-paper display device; an electronic ink layer is formed on the array substrate, and the pixel electrode of each pixel unit is configured to apply voltage for driving the movement of charged micro-particles in electronic ink so as to perform display operation.

The terms "first", "second" and the like in the text are only used for distinguishing one entity or operation from another entity or operation and do not indicate or imply any relationship or sequence between the entities or operations. The terms "comprise", "include" and the like are open expressions and do not exclude that the included process, method or article also includes other elements. It should be also noted that the orientational or positional relationship indicated by "on", "below" or the like is the orientational or positional relationship as illustrated in the accompanying drawings, is only for the purpose of convenient description and simplified description of the present disclosure, and does not indicate or imply that the referred device or element must have specific orientation and be constructed and operated in a particular orientation, and hence cannot be construed as the limitation of the present disclosure. Unless otherwise specified, the terms "arranged""connected" and "connection" shall have a widened meaning, for instance, may be fixed connection, detachable connection or integral connection, may be mechanical connection or electrical connection, may be direct connection, indirect connection through an intermediate, and may be internal communication of two elements. The specific meanings of the above terms in the present disclosure may be understood by those skilled in the art according to specific conditions.

What are described above is related to the illustrative embodiments of the disclosure only and not limitative to the scope of the disclosure; the scopes of the disclosure are defined by the accompanying claims.

The application claims priority to the Chinese patent application No. 201620080097.6, filed on Jan. 27, 2016, the entire disclosure of which is incorporated herein by reference as part of the present application.

What is claimed is:

1. An array substrate, comprising:
   a base substrate; and
   a gate metal layer, an active layer and a source/drain metal layer disposed on the base substrate,
   wherein the active layer is disposed between the base substrate and the gate metal layer
   wherein the gate metal layer includes a gate line and a storage electrode line that extends in parallel to the gate line; the source/drain metal layer includes a data line that intersects with the gate line; and
   the active layer includes a first pattern taken as a channel region of a thin-film transistor (TFT) and a second pattern at least partially overlapped with the storage electrode line in a thickness direction of the base substrate, or the source/drain metal layer further includes a metal layer pattern at least partially overlapped with the storage electrode line in the thickness direction of the base substrate.

2. The array substrate according to claim 1, wherein the active layer includes the first pattern taken as the channel region of the TFT and the second pattern at least partially overlapped with the storage electrode line in the thickness direction of the base substrate, and the source/drain metal layer includes the metal layer pattern at least partially overlapped with the storage electrode line in the thickness direction of the base substrate.

3. The array substrate according to claim 1, wherein the second pattern is connected with the first pattern.

4. An array substrate, comprising;
a base substrate; and
a gate metal layer, an active layer and a source/drain metal layer disposed on the base substrate,
wherein the gate metal layer includes a gate line and a storage electrode line that extends in parallel to the gate line; and
the active layer includes a first pattern taken as a channel region of a thin-film transistor (TFT) and a second pattern at least partially overlapped with the storage electrode line in a thickness direction of the base substrate, or the source/drain metal layer includes a data line and a metal layer pattern at least partially overlapped with the storage electrode line in the thickness direction of the base substrate,
wherein the second pattern is connected with the first pattern; the second pattern includes a connection part and an overlapping part connected with the connection part; the connection part is connected with the first pattern; and the overlapping part is overlapped with the storage electrode line in the thickness direction of the base substrate.

5. The array substrate according to claim 4, wherein the overlapping part is disposed at an intersection position between the storage electrode line and the data line.

6. The array substrate according to claim 5, wherein the connection part and the data line have a same extension direction, and an orthographic projection of the connection part on a first primary surface of the base substrate is disposed in an orthographic projection of the data line on the first primary surface of the base substrate.

7. The array substrate according to claim 6, wherein a dimension of the overlapping part is greater than that of the connection part in a transverse direction of the data line.

8. The array substrate according to claim 4, wherein the overlapping part is a platy structure.

9. The array substrate according to claim 4, wherein the storage electrode line is provided with a widened portion at an intersection position between the storage electrode line and the data line.

10. The array substrate according to claim 9, wherein an orthographic projection of the widened portion on the first primary surface of the base substrate coincides with an orthographic projection of the overlapping part on the first primary surface of the base substrate.

11. The array substrate according to claim 1, wherein the metal layer pattern is disposed at an intersection position between the storage electrode line and the data line.

12. The array substrate according to claim 11, wherein the metal layer pattern and the data line are in an integral structure.

13. The array substrate according to claim 12, wherein the metal layer pattern is a platy structure.

14. The array substrate according to claim 12, wherein a dimension of the metal layer pattern in a transverse direction of the data line is greater than a width of the data line.

15. The array substrate according to claim 14, wherein the dimension of the metal layer pattern in a transverse direction of the storage electrode line is not greater than a width of the storage electrode line.

16. An array substrate, comprising:
a base substrate; and
a gate metal layer, an active layer and a source/drain metal layer disposed on the base substrate,
wherein the gate metal layer includes a gate line and a storage electrode line that extends in parallel to the gate line; and
the active layer includes a first pattern taken as a channel region of a thin-film transistor (TFT) and a second pattern at least partially overlapped with the storage electrode line in a thickness direction of the base substrate, or the source/drain metal layer includes a data line and a metal layer pattern at least partially overlapped with the storage electrode line in the thickness direction of the base substrate,
wherein the metal layer pattern is disposed at an intersection position between the storage electrode line and the data line and the storage electrode line is provided with a widened portion at an intersection position between the storage electrode line and the data line.

17. The array substrate according to claim 16, wherein an orthographic projection of the widened portion on a first primary surface of the base substrate coincides with an orthographic projection of the metal layer pattern on the first primary surface of the base substrate.

18. A display device, comprising the array substrate according to claim 1.

* * * * *